United States Patent
Takeuchi et al.

(10) Patent No.: US 7,002,437 B2
(45) Date of Patent: Feb. 21, 2006

(54) PIEZOELECTRIC THIN-FILM RESONATOR, PIEZOELECTRIC FILTER, AND ELECTRONIC COMPONENT INCLUDING THE PIEZOELECTRIC FILTER

(75) Inventors: Masaki Takeuchi, Otsu (JP); Hajime Yamada, Otsu (JP); Hideki Kawamura, Shiga-ken (JP); Daisuke Nakamura, Shiga-ken (JP); Yukio Yoshino, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 28 days.

(21) Appl. No.: 10/456,173

(22) Filed: Jun. 6, 2003

(65) Prior Publication Data

US 2004/0140868 A1    Jul. 22, 2004

(30) Foreign Application Priority Data

Jun. 11, 2002  (JP)  .............................. 2002-170321
Apr. 23, 2003  (JP)  .............................. 2003-117909

(51) Int. Cl.
*H03H 9/15*     (2006.01)
*H03H 9/54*     (2006.01)

(52) U.S. Cl. ...................... 333/187; 333/189; 310/322
(58) Field of Classification Search ........ 333/186–192; 310/322

See application file for complete search history.

(56) References Cited

U.S. PATENT DOCUMENTS

| | | | | |
|---|---|---|---|---|
| 4,320,365 A | * | 3/1982 | Black et al. ................. | 333/187 |
| 5,692,279 A | * | 12/1997 | Mang et al. ................. | 29/25.35 |
| 5,873,154 A | * | 2/1999 | Ylilammi et al. ........... | 29/25.35 |
| 6,081,171 A | * | 6/2000 | Ella ............................ | 333/189 |
| 6,204,737 B1 | * | 3/2001 | Ella ............................ | 333/187 |
| 6,329,305 B1 | * | 12/2001 | Bower et al. ................ | 438/800 |
| 6,476,536 B1 | * | 11/2002 | Pensala ...................... | 310/312 |
| 6,486,751 B1 | * | 11/2002 | Barber et al. ................ | 333/187 |
| 6,586,861 B1 | * | 7/2003 | Misu et al. .................. | 310/324 |
| 6,734,763 B1 | * | 5/2004 | Nishihara et al. ........... | 333/187 |
| 6,842,088 B1 | * | 1/2005 | Yamada et al. ............. | 333/187 |

FOREIGN PATENT DOCUMENTS

| | | |
|---|---|---|
| JP | 58-121817 | 7/1983 |
| JP | 58-137317 | 8/1983 |
| JP | 2000-69594 | 3/2000 |
| JP | 2001-156582 | 6/2001 |
| JP | 2001-168674 | 6/2001 |
| JP | 2001-274650 | 10/2001 |

\* cited by examiner

*Primary Examiner*—Barbara Summons
(74) *Attorney, Agent, or Firm*—Keating & Bennett, Ltd.

(57) ABSTRACT

A piezoelectric thin-film resonator includes a supporting substrate. A piezoelectric thin-film is formed on the supporting substrate. A lower electrode and an upper electrode are formed with the piezoelectric thin-film therebetween. The stiffness of at least one of the lower and upper electrodes is higher than that of the piezoelectric thin-film.

23 Claims, 11 Drawing Sheets

PIEZOELECTRIC THIN-FILM RESONATOR, PIEZOELECTRIC FILTER, AND ELECTRONIC COMPONENT INCLUDING THE PIEZOELECTRIC FILTER

BACKGROUND OF THE INVENTION

1. Field of the Invention

The present invention relates to a piezoelectric thin-film resonator used for filters in a high-frequency band (RF band, particularly, GHz band or more) of communication apparatuses, such as mobile phones. The present invention also relates to a piezoelectric filter including the resonator and an electronic component including the piezoelectric filter, such as a duplexer.

2. Description of the Related Art

In recent years, filters used in a high-frequency band (RF band, particularly, GHz band or more) for use in communication apparatuses, such as mobile phones, have been developed by using piezoelectric resonators having excellent characteristics. Such a piezoelectric resonator is small, lightweight, and highly resistant to vibration and shock. Furthermore, variations in products are small, highly reliable, and circuits need not be adjusted. Thus, mounting can be automated and simplified. In addition, a piezoelectric resonator having a high frequency can be easily manufactured.

The above-described piezoelectric resonator includes a piezoelectric substrate and electrodes provided on both principal surfaces thereof. The piezoelectric resonator operates in a thickness-longitudinal vibration mode or a thickness-shear vibration mode. The resonance frequency of the piezoelectric resonator in the thickness-longitudinal vibration mode of the piezoelectric substrate is inversely proportional to the thickness of the piezoelectric substrate, and thus the piezoelectric substrate must be extremely thin for a use in an ultra high-frequency region.

However, the thickness of the piezoelectric substrate can be reduced only within limits of mechanical strength and handling, and a practical high-frequency limit is several hundred MHz in a fundamental mode. In order to overcome such a problem, the usage of a piezoelectric thin-film resonator has been proposed for use in filters and resonators (for example, reference 1: Japanese Unexamined Patent Application Publication No. 2001-168674, published on Jun. 22, 2001).

In this piezoelectric thin-film resonator, a thin-film supporting portion can be thinned by using micromachining techniques, and a thin piezoelectric thin-film can be formed by sputtering or the like. Thus, a high-frequency characteristic of several hundred to several thousand MHz can be achieved.

Also, a piezoelectric resonator which includes an $SiO_2$ thin-film having a positive resonance-frequency temperature characteristic has been proposed so as to improve the temperature characteristic of the resonance frequency (reference 2: Japanese Unexamined Patent Application Publication No. 58-121817, published on Jul. 20, 1983 and reference 3: Japanese Unexamined Patent Application Publication No. 58-137317, published on Aug. 15, 1983).

Also, a piezoelectric resonator including a lower electrode, a piezoelectric layer including AlN, and an upper electrode has been proposed in order to increase Q of the piezoelectric resonator (reference 4: Japanese Unexamined Patent Application Publication No. 2000-69594, published on Mar. 3, 2000). In this piezoelectric resonator, the electrodes include Mo, which has a low thermoelesticity loss.

Further, in a piezoelectric resonator shown in reference 5 (Japanese Unexamined Patent Application Publication No. 2001-156582, published on Jun. 8, 2001), an electrode includes two layers of Pt and Al in order to reduce the ratio of Pt in the electrode. Also, Al having a low resistivity is used. With this configuration, by reducing the ratio of Pt in the electrode in order to reduce the mass additional effect and by increasing the ratio of Al having a low resistivity in order to reduce the resistance of the entire electrode, the resonance frequency can be improved and the Q of the piezoelectric resonator can be increased.

However, in the piezoelectric resonator according to reference 5, the filter characteristics widely vary and high manufacturing precision is required, which leads to an increase in the manufacturing cost.

Also, as in references 2 and 3, when a $SiO_2$ thin-film is used to improve the temperature characteristic, Q of the piezoelectric resonator decreases because the stiffness of $SiO_2$ is low.

On the other hand, because the piezoelectric resonator shown in reference 4 includes Mo and AlN, the temperature coefficient of frequency (TFC) is unfavorable and the TFC cannot be adjusted.

SUMMARY OF THE INVENTION

In order to solve the above described problems, a first preferred embodiment of the present invention provides a piezoelectric thin-film resonator including a supporting substrate, a piezoelectric thin-film formed on the supporting substrate, and a first electrode and a second electrode facing each other with the piezoelectric thin-film therebetween. The stiffness of at least one of the first and second electrodes is higher than that of the piezoelectric thin-film.

Preferably, the stiffness of at least one of the first and second electrodes is higher than the stiffness of the piezoelectric thin-film in a direction that is substantially parallel to a vibration direction of the piezoelectric thin-film.

With this configuration, because the stiffness of at least one of the first and second electrodes is higher than that of the piezoelectric thin-film, at least one of the first and second electrodes can function as an elastic member along the vibrating direction of the piezoelectric thin-film. Also, the Q of resonance of the piezoelectric thin-film can be increased and shouldering of the filter characteristic can be improved, that is, attenuation per unit frequency can be increased.

A second preferred embodiment of the present invention provides a piezoelectric thin-film resonator including a supporting substrate, a piezoelectric thin-film formed on the supporting substrate, and a first electrode and a second electrode facing each other with the piezoelectric thin-film therebetween. A base electrode having orientation is provided under at least one of the first and second electrodes.

With this configuration, crystallinity of at least one of the first and second electrodes can be improved and the crystallinity of the piezoelectric thin-film can be also improved. Accordingly, the resonance characteristics can be improved.

Preferably, the stiffness of at least one of the first and second electrodes is higher than that of the piezoelectric thin-film.

The stiffness of at least one of the first and second electrodes is higher than the stiffness of the piezoelectric thin-film in a direction that is substantially parallel to a vibration direction of the piezoelectric thin-film.

At least one of the first and second electrodes includes at least one of Ta, Nb, Mo, Pt, W, Al alloy, and elinvar. The stiffness of these materials is higher than that of the piezoelectric thin-film. Thus, Q and $k^2$ can be increased, and the resonance characteristic can be improved.

Preferably, the base electrode includes at least one of Ti, NiCr, and Cr. With this configuration, the adhesion strength of at least one of the first and second electrodes is increased. As a result, at least one of the first and second electrodes is prevented from being peeled off, and thus deterioration of characteristics caused by the peeling off can be prevented.

The piezoelectric thin-film is preferably excited in a thickness-longitudinal vibration mode or in a thickness-shear vibration mode.

Preferably, the supporting substrate includes an opening or a recessed portion, and a vibrating portion of the piezoelectric thin-film is positioned above the opening or the recessed portion. With this configuration, suppression of the vibration of the piezoelectric thin-film can be reduced and the Q of the piezoelectric thin-film can be increased.

Preferably, an insulating film is formed between the piezoelectric thin-film and the supporting substrate. With this configuration, the ratio between the piezoelectric thin-film and the insulating film supporting the piezoelectric thin-film can be increased and the resonance response in a low mode is improved. Accordingly, the operation in a low mode is stabilized.

Also, in this configuration, by combining the temperature characteristics of the resonance frequency of the piezoelectric thin-film and the insulating film, the total temperature characteristic can be close to zero. Accordingly, even if the temperature rises during operation, variations in the characteristics are suppressed and operation reliability is increased.

Preferably, the insulating film includes a plurality of insulating thin-films having different temperature coefficients.

With this configuration, by combining the temperature characteristics of the resonance frequency of the piezoelectric thin-film and the plurality of insulating films, the total temperature characteristic can be reliably close to zero. Accordingly, even if the temperature rises during operation, variation in the characteristic are reliably suppressed and operation reliability is further increased.

Preferably, the insulating film includes a plurality of insulating thin-films in which at least one of the plurality of insulating thin-films generates compressive stress and at least another of the plurality of insulating thin-films generates tensile stress.

With this arrangement, because the insulating thin-films generate different internal stress, each internal stress in the piezoelectric thin-film and the insulating film can be offset so that the total stress is almost zero. Accordingly, variations in the characteristics during operation are reliably reduced and the operation reliability is further increased.

The insulating film may include at least one of a silicon dioxide film and an aluminum oxide film.

Preferably, the vibration mode is an n-th vibration mode, where n is an integer of 2 or more. With this arrangement, the thickness of the piezoelectric thin-film can be ensured even when a high-frequency is used. Also, the manufacturing method can be simplified, and decrease in impact resistance and electrical power resistance can be suppressed.

Furthermore, by using a secondary mode, for example, the temperature characteristics of resonance frequency of the piezoelectric thin-film and the insulating film are combined so that the total temperature characteristic can be easily set to almost zero. Accordingly, even if the temperature rises during operation, variations in the characteristics are suppressed and operation reliability is further increased.

Preferably, the piezoelectric thin-film includes zinc oxide.

A third preferred embodiment of the present invention provides a piezoelectric filter including the piezoelectric thin-film resonator according to the preferred embodiments described above. By using the above-described piezoelectric thin-film resonator, the filter characteristic are improved.

A fourth preferred embodiment of the present invention provides an electronic component including the above-described piezoelectric filter. By using the above-described piezoelectric filter, the filter characteristic are improved and a duplexer having an excellent resolution can be obtained.

Other features, elements, characteristics and advantages of the present invention will become more apparent from the following detailed description of preferred embodiments thereof with reference to the attached drawings.

BRIEF DESCRIPTION OF THE DRAWINGS

FIGS. 9A and 9B show modifications of the ladder filter in which FIG. 9A shows a t-type and FIG. 9B shows a Π-type;

DETAILED DESCRIPTION OF PREFERRED EMBODIMENTS

Hereinafter, preferred embodiments of the present invention of a piezoelectric thin-film resonator, a piezoelectric filter using the resonator, and a duplexer serving as an electronic component including the filter of the present invention will be described with reference to FIGS. 1 to 10.

First Preferred Embodiment

A method of manufacturing a piezoelectric thin-film resonator 10 according to the first preferred embodiment of the present invention will be described with reference to FIG. 1.

First, silicon dioxide ($SiO_2$) films 1a and 1b serving as insulating films are formed on both principal surfaces of a supporting substrate 2, which includes (100)-oriented silicon, by thermal oxidation or sputtering. Then, a substantially rectangular window 1c, which has an edge that is substantially parallel to the (110)-direction, is formed in the SiO$_2$ film 1b on the rear surface of the supporting substrate 2. By using the SiO$_2$ film 1b having the window 1c as a mask, the silicon of the supporting substrate 2 is etched in a tetramethyl ammonium hydroxide (TMAH) solution under a temperature of about 90° C.

In the TMAH, the etching rate greatly depends on crystal orientation. Thus, as the etching process proceeds, a (111)-plane 2a, which forms an angle of about 55° with respect to a (100)-plane in the direction of the surface of the supporting substrate 2, is formed, so that an opening which extends through the supporting substrate 2 in the thickness direction is formed.

The etching process is completely stopped at the SiO$_2$ film 1a on the front surface of the supporting substrate 2. Accordingly, a smooth resonator surface can be obtained and the thickness of the entire resonator is set precisely.

Then, an alumina (Al$_2$O$_3$) film 3, serving as an insulating film, is formed on the SiO$_2$ film 1a by vacuum evaporation or sputtering, so that a diaphragm including the SiO$_2$ film 1a and the Al$_2$O$_3$ film 3 is formed. With this configuration, the diaphragm faces the opening (hollow portion) defined by the (111)-plane 2a of the supporting substrate 2.

In the above-described diaphragm, the SiO$_2$ film 1a has a positive resonance-frequency temperature characteristic and generates compressive stress. The Al$_2$O$_3$ film 3 has a negative resonance-frequency temperature characteristic and generates tensile stress.

Then, a lower electrode (first electrode) 4 including Al, a piezoelectric thin-film 5 mainly including zinc oxide (ZnO), and an upper electrode (second electrode) 6 including Ni, are formed in that order on the diaphragm by vacuum evaporation or sputtering and etching. Accordingly, the piezoelectric thin-film resonator 10 is obtained. The piezoelectric thin-film 5 has a negative resonance-frequency temperature characteristic and generates compressive stress.

In the piezoelectric thin-film resonator 10, the resonance frequency depends on the thickness of the entire vibrating portion including the insulating layer having the SiO$_2$ film 1a and the Al$_2$O$_3$ film 3, the lower electrode 4, the piezoelectric thin-film 5, and the upper electrode 6.

Also, in the piezoelectric thin-film resonator 10, the total thickness of the SiO$_2$ film 1a, the Al$_2$O$_3$ film 3, the lower electrode 4, the piezoelectric thin-film 5, and the upper electrode 6 are preferably about 3 $\mu$m, and the area of the diaphragm (vibrating portion) is preferably about 600 $\mu$m×600 $\mu$m.

Further, the resonance frequency of the piezoelectric thin-film resonator 10 can be changed by changing the position of the piezoelectric thin-film resonator 10 and by changing the size and thickness of the lower and upper electrodes.

In the piezoelectric thin-film resonator 10, the thickness of the SiO$_2$ film 1a and the Al$_2$O$_3$ film 3, the area of the lower electrode 4 and the upper electrode 6, and the thickness of the piezoelectric thin-film 5 are preferably set so that the piezoelectric thin-film resonator 10 vibrates in a secondary vibration mode. Accordingly, in the piezoelectric thin-film resonator 10, the temperature coefficient (ppm/° C.) of the resonance frequency can be easily set to almost zero.

Further, in the piezoelectric thin-film resonator 10, the total thickness of the SiO$_2$ film 1a and the Al$_2$O$_3$ film 3 and the total thickness of the piezoelectric thin-film 5, the lower electrode 4, and the upper electrode 6 are preferably set so that the resonator 10 resonates at a half-wavelength of a desired resonance frequency. That is, the thickness of at least one of the lower electrode 4 and the upper electrode 6 is preferably set in accordance with the desired resonance frequency. With this arrangement, the vibration mode of the piezoelectric thin-film resonator 10 can reliably be the secondary mode.

More preferably, in the piezoelectric thin-film resonator 10, the lower electrode 4, the piezoelectric thin-film 5, and the upper electrode 6 are arranged so that the piezoelectric thin-film resonator 10 traps energy therein. Accordingly, vibration energy does not leak out into the supporting substrate 2 along the diaphragm, and thus high-Q resonance is generated.

In this way, the piezoelectric thin-film resonator 10, the SiO$_2$ film 1a and the Al$_2$O$_3$ film 3, serving as insulating films (supporting films) can be extremely thin. Therefore, a piezoelectric thin-film resonator which operates in a fundamental mode or at a low overtone (for example, secondary mode) at a high-frequency of 100 MHz or more is obtained. Further, in the piezoelectric thin-film resonator 10, the temperature characteristic and inner stress of each film offset each other, and thus the bad effects of variations in temperature and internal stress are prevented.

Also, the dimensions of the diaphragm of the piezoelectric thin-film resonator are very small, for example, several hundred $\mu$m or less, and the manufacturing process thereof is compatible with the manufacturing processes of semiconductor integrated circuits. Thus, the resonator can be incorporated into an integrated circuit. Further, in the piezoelectric thin-film resonator 10, submicron patterning, which is required in surface acoustic wave (SAW) devices, is not required, even at several GHz, and thus the manufacturing method is simplified.

Figure 11:
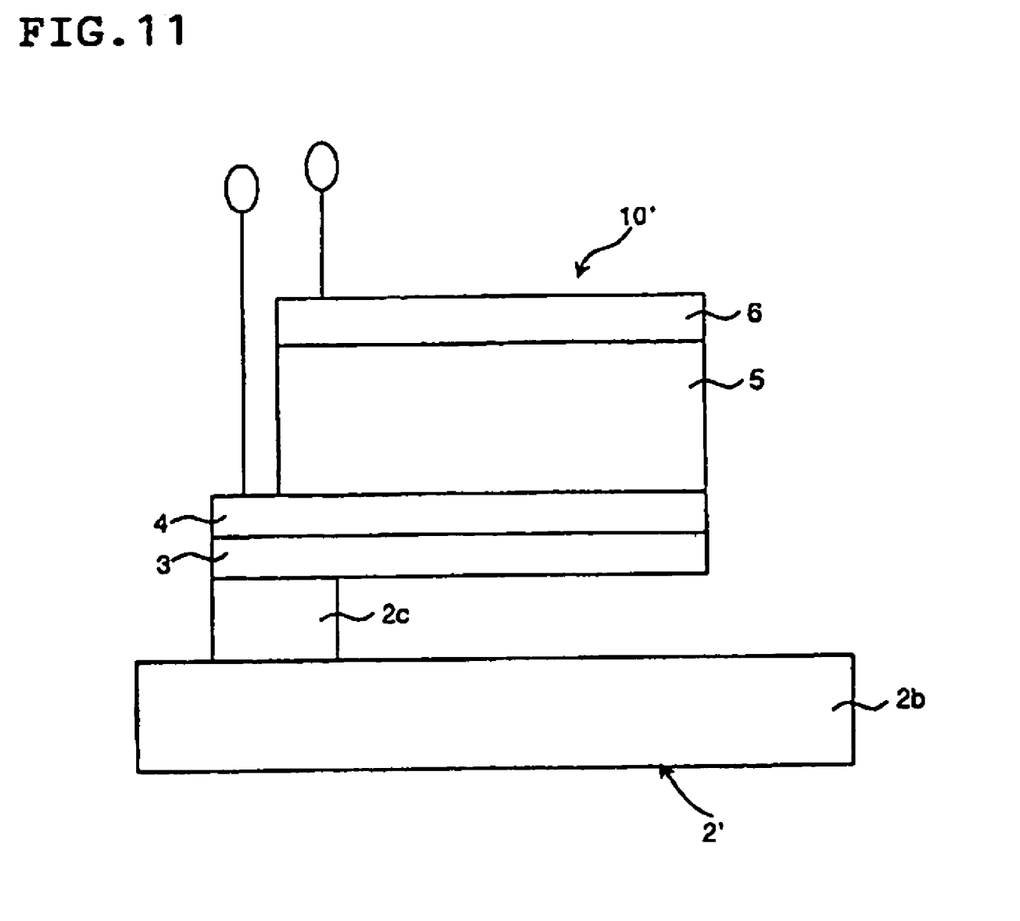
FIG. 11 is a cross-sectional view showing a modified configuration of a piezoelectric thin-film resonator according to another preferred embodiment of the present invention.

In the piezoelectric thin-film resonator 10, the diaphragm faces the opening. However, the diaphragm does not deteriorate the Q of vibration and may be in contact with a gas such as air. Therefore, the diaphragm may face a recessed portion provided in the supporting substrate 2 or a gap formed between the diaphragm and the supporting substrate 2. Alternatively, the piezoelectric thin-film resonator 10' may have a cantilever structure or an overhang structure as shown in FIG. 11. The structure of the piezoelectric thin-film resonator 10' shown in FIG. 11 is substantially the same as the piezoelectric thin-film resonator 10, except for the substrate 2'. The substrate 2' includes a base portion 2b and a support portion 2c extending between the base portion 2b and the piezoelectric thin-film 5 for supporting the piezoelectric thin-film in a cantilever or overhang configuration.

Preferably, the piezoelectric thin-film resonator 10 includes the electrodes including Ni and Al, the piezoelectric thin-film including ZnO, and the films forming the diaphragm including Al$_2$O$_3$ and SiO$_2$, and preferably vibrates in a thickness-longitudinal vibration mode. Alternatively, the piezoelectric thin-film may include AlN, PZT, or CdS, and the diaphragm may include SiN. Further, the vibration mode may be a thickness-shear vibration mode, an extensional vibration mode, or a flexion vibration mode.

The upper electrode 6 may include Ta, Nb, Mo, Pt, W, stainless alloy, Al alloy, Al with additives (for example, Cu, Mg, Si, and Zn), or a constant elastic material such as elinvar. The elinvar is an Fe—Ni—Cr alloy, and the expansion coefficient thereof can be controlled by heat-treating the alloy at the vicinity of the magnetic-phase transition point.

Also, the upper electrode 6 is formed so that the stiffness thereof in a direction that is substantially parallel to the excitation direction of a vibration wave (polarization direction) of the piezoelectric thin-film 5 is higher than the stiffness in the same direction of the piezoelectric thin-film 5. That is, the stiffness of the upper electrode 6 is preferably about $2.3 \times 10^{11}$ Pa or more when the piezoelectric thin-film 5 includes ZnO.

The lower electrode 4 may include the same material as that for the upper electrode 6 so as to obtain the equivalent effects. Preferably, the difference between the lattice constant in the direction vertical to the vibration direction of the piezoelectric thin-film 5 (in this case ZnO) and the lattice constant in the direction vertical to the vibration direction of the material for the electrode is about 5% or less. In this case, the crystallinity of the piezoelectric thin-film 5 formed on the lower electrode 4 is improved, and thus the piezoelectric characteristics are further improved.

Figure 2:
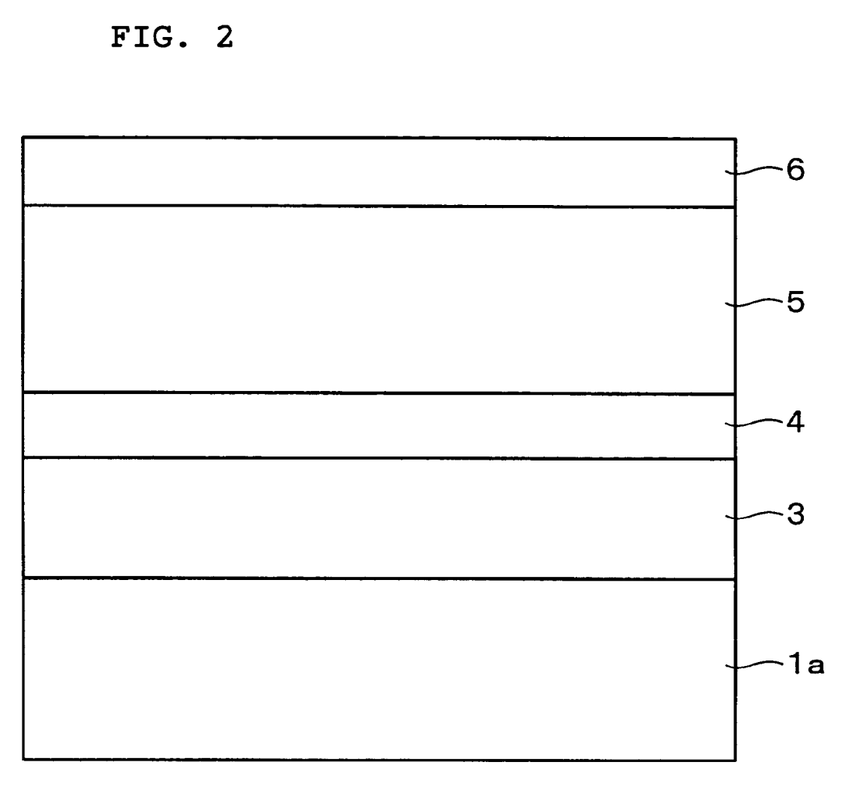
FIG. 2 is an enlarged view showing a portion of the piezoelectric thin-film resonator.

Now, various examples in which various types of metal are used for the upper electrode 6 will be described. First, as shown in FIG. 2, each layer of the piezoelectric thin-film resonator was formed. Examples of a metallic material for the upper electrode 6 are shown in Table 1. The upper electrode 6 has a thickness of about 0.18 $\mu$m. The piezoelectric thin-film 5 including ZnO has a thickness of about 1.25 $\mu$m, the lower electrode 4 including Al has a thickness of about 0.18 $\mu$m, the $Al_2O_3$ film 3 has a thickness of about 0.45 $\mu$m, and the $SiO_2$ film 1a has a thickness of about 1.2 $\mu$m.

Table 1 shows the characteristics of the resonator, which change in accordance with the material used for the upper electrode 6. As can be seen in Table 1, Q and $k^2$ are higher when Mo, Ni, Nb, or Ta, having a stiffness that is higher than that of the piezoelectric thin-film 5, are used for the upper electrode 6, when compared to the case where Al, having a stiffness that is lower than that of the piezoelectric thin-film 5, is used for the upper electrode 6. This is because the piezoelectric thin-film resonator easily vibrates by using a high-stiffness material and that the vibration energy loss of the piezoelectric thin-film resonator is reduced.

The stiffness $C_{11}^D$ of Pt is high, about $3.47 \times 10^{11}$ Pa. Therefore, when Pt is used for the upper electrode 6, high Q and $k^2$ can be obtained as when Mo, Ni, Nb, or Ta is used.

TABLE 1

|  | Mo | Ni | Nb | Ta | Al |
|---|---|---|---|---|---|
| Stiffness $C_{11}^D$ | 4.63 | 2.51 | 2.46 | 2.61 | 1.07 |
| Q | 2032 | 2037 | 2041 | 2037 | 1320 |
| $k^2$ (%) | 3.87 | 3.86 | 3.86 | 3.86 | 3.81 |

In Table 1, the unit of stiffness $C_{11}^D$ is $\times 10^{11}$ Pa, and the resonance frequency was between about 1800 MHz and about 2000 MHz. The stiffness of the other materials was as follows: the stiffness $C_{11}^D$ of $SiO_2$ was $0.785 \times 10^{11}$ Pa; the stiffness $C_{11}^D$ of $Al_2O_3$ was $3.746 \times 10^{11}$ Pa; the stiffness $C_{11}^D$ of AlN was $4.15 \times 10^{11}$ Pa; and the stiffness $C_{33}^D$ of ZnO was $2.299 \times 10^{11}$ Pa.

Figure 3:
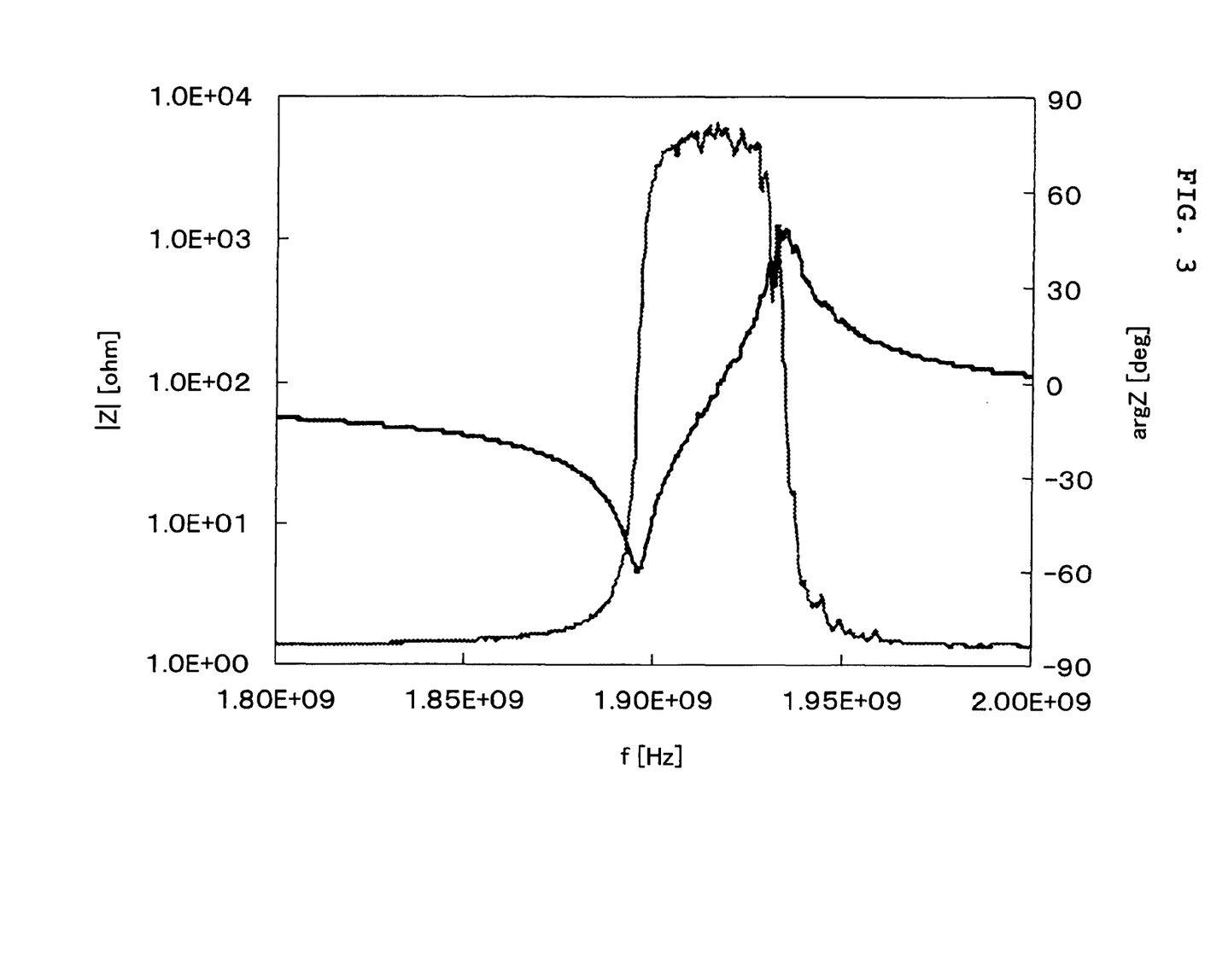
FIG. 3 shows the filter characteristics of a piezoelectric thin-film resonator of a comparative example in which Al is used for an upper electrode.

Hereinafter, various examples in which the material and thickness of the upper electrode 6 are changed will be discussed. For comparison, the configuration and the thickness of each film of the piezoelectric thin-film resonator were set as follows: Al/ZnO/Al/$Al_2O_3$/$SiO_2$=0.16/1.27/0.17/0.46/1.21 ($\mu$m). The filter characteristics in this case are shown in FIG. 3 and Table 2.

Figure 4:
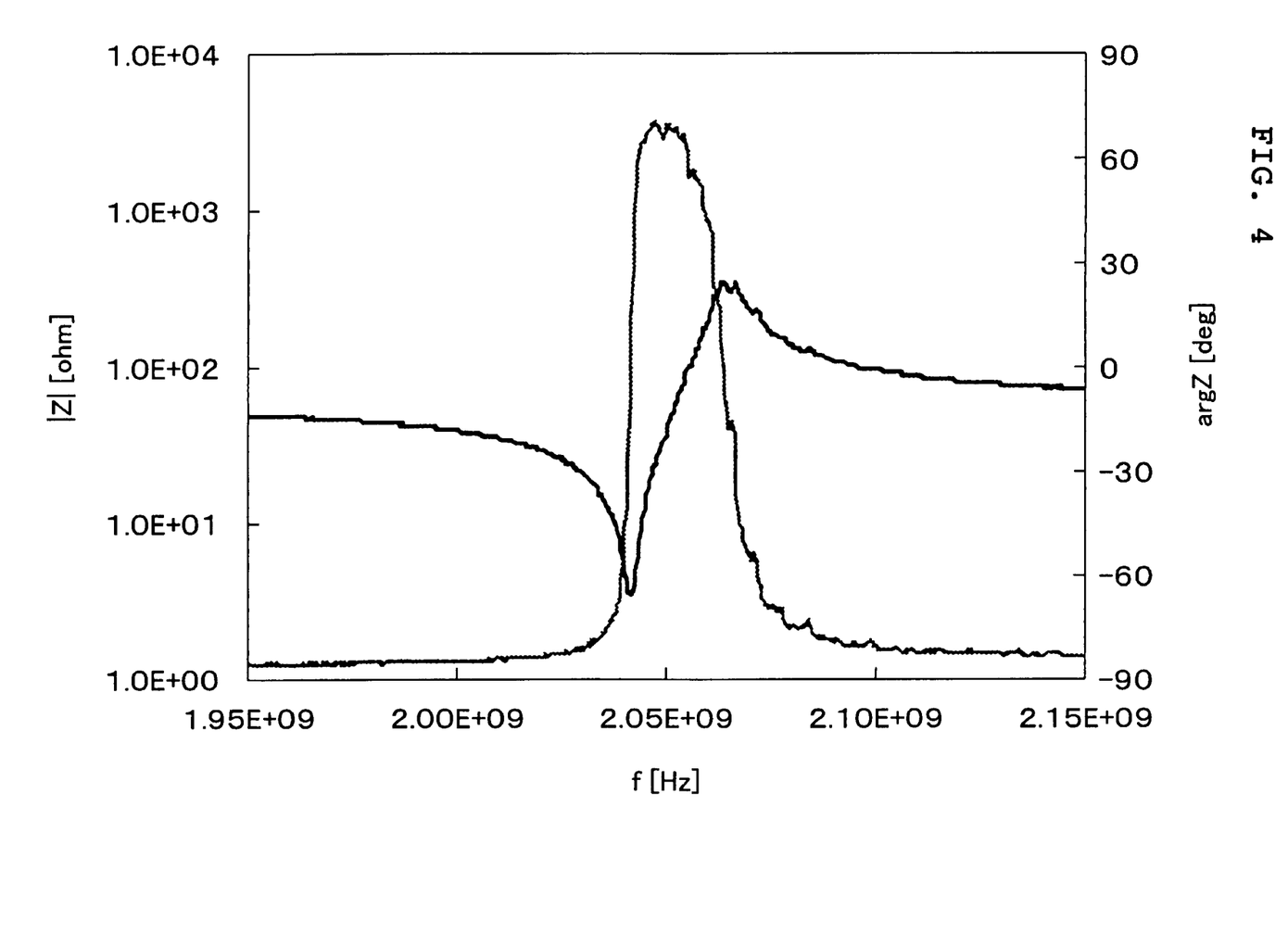
FIG. 4 shows the filter characteristics of the piezoelectric thin-film resonator of the first preferred embodiment of the present invention in which Ni is used for an upper electrode.

In a first example, the configuration and the thickness of each film of the piezoelectric thin-film resonator in accordance with the first preferred embodiment of the present invention were set as follows: Ni/ZnO/Al/$Al_2O_3$/$SiO_2$=0.14/1.08/0.17/0.40/1.20 ($\mu$m). The filter characteristics in this case are shown in FIG. 4 and Table 2.

Figure 5:
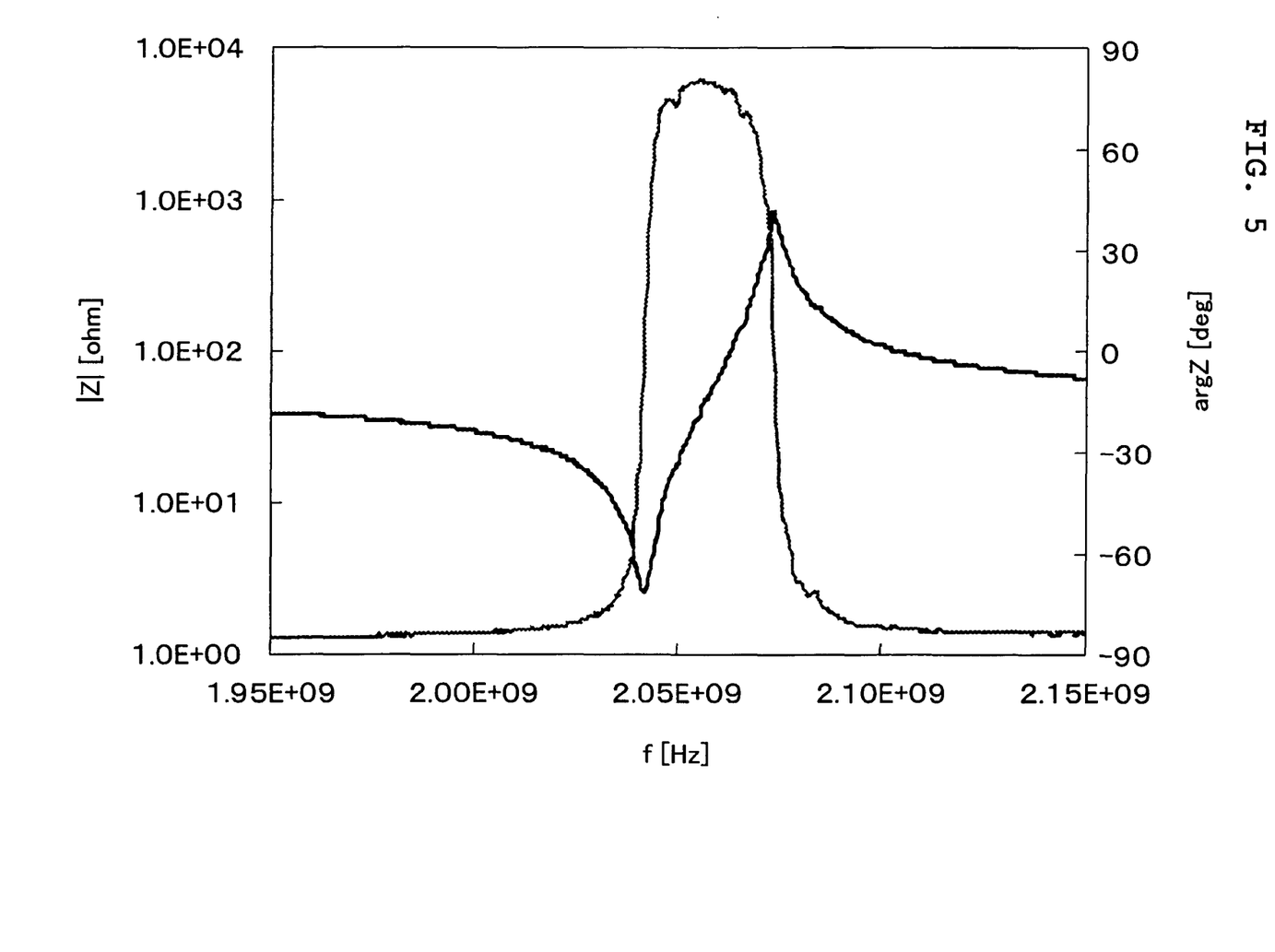
FIG. 5 shows the filter characteristics of the piezoelectric thin-film resonator of the first preferred embodiment of the present invention in which Pt is used for the upper electrode.

In a second example, the configuration and the thickness of each film of the piezoelectric thin-film resonator in accordance with the first preferred embodiment of the present invention were set as follows: Pt/ZnO/Al/$Al_2O_3$/$SiO_2$=0.1/0.98/0.17/0.40/1.21 ($\mu$m). The filter characteristics in this case are shown in FIG. 5 and Table 2.

Figure 6:
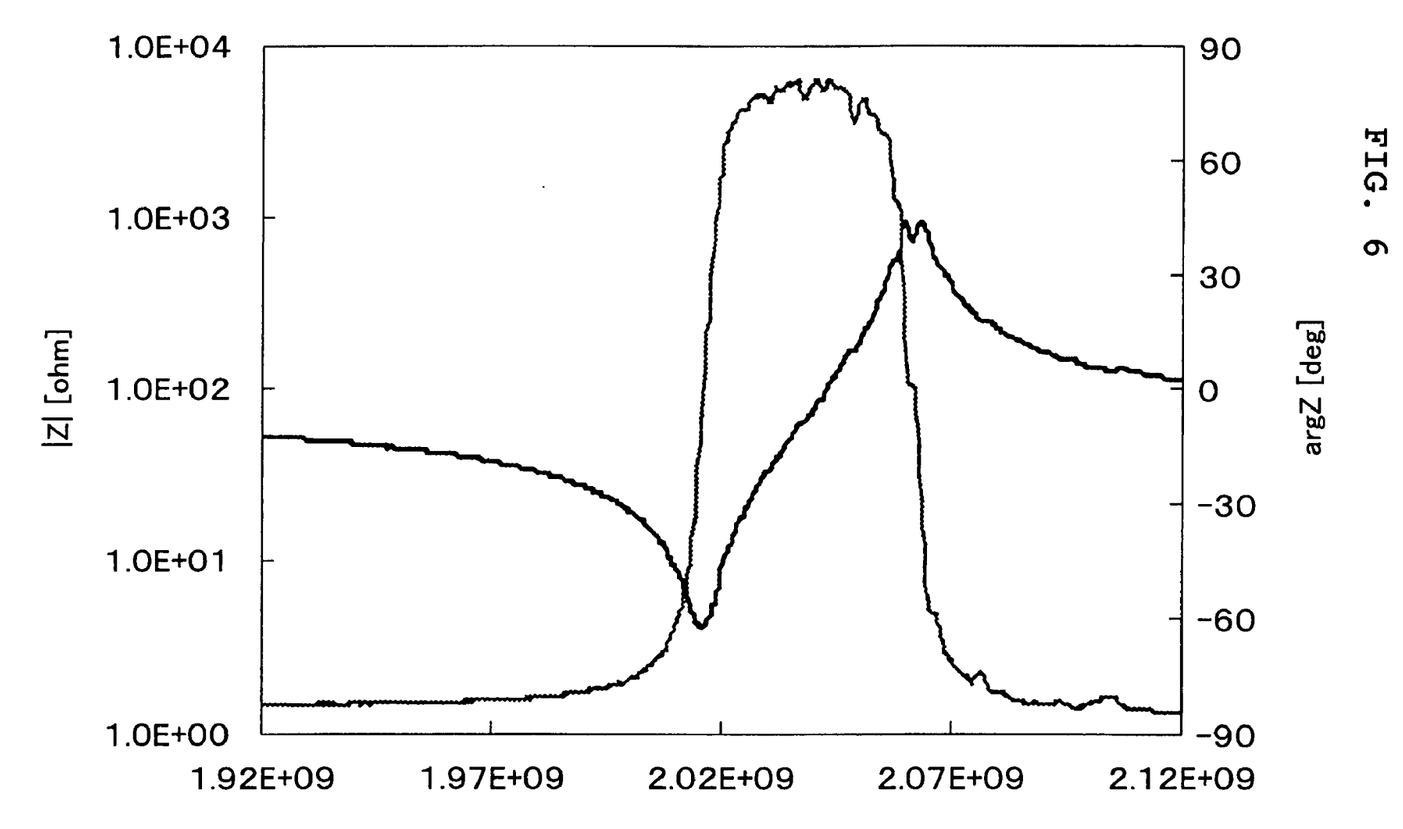
FIG. 6 shows the filter characteristics of the piezoelectric thin-film resonator of the first preferred embodiment of the present invention in which Mo is used for the upper electrode.

In a third example, the configuration and the thickness of each film of the piezoelectric thin-film resonator in accordance with the first preferred embodiment of the present invention were set as follows: Mo/ZnO/Al/$Al_2O_3$/$SiO_2$=0.14/1.09/0.17/0.40/1.23 ($\mu$m). The filter characteristics in this case are shown in FIG. 6 and Table 2.

TABLE 2

| Material of electrode | Q (–) | $K^2$ (%) | Q × $k^2$ | Resonance resistance ($\Omega$) | Antiresonance resistance ($\Omega$) |
|---|---|---|---|---|---|
| Ni | 950 | 2.4 | 2280 | 3.4 | 450 |
| Pt | 710 | 3.1 | 2160 | 2.7 | 633 |
| Mo | 400 | 4.5 | 1810 | 4.3 | 850 |
| Ta | 170 | 4.6 | 760 | 13.0 | 920 |
| Al | 450 | 4.1 | 1830 | 4.5 | 1180 |

As can be seen in Tables 1 and 2, Ni is a preferable material for the upper electrode 6.

Further, because Al is used for the lower electrode 4, the difference between the lattice constant in the direction vertical to the vibration direction of the piezoelectric thin-film 5 and the lattice constant in the direction vertical to the vibration direction of the material for the electrode is about 2%. Accordingly, preferable crystallinity and piezoelectric characteristics of a ZnO film on the Al film are obtained. Therefore, preferable resonance characteristics are also obtained.

The same effect can be obtained when Pt is used instead of Al. Because the difference between the lattice constant of Pt and that of ZnO is small and Pt is resistant to oxidization, a ZnO film having a good crystallinity is obtained. Therefore, Pt is preferably used for the lower electrode 4.

In this preferred embodiment, the temperature coefficient of frequency (TCF) is adjusted by using $SiO_2$. However, because the stiffness of $SiO_2$ is low, the initial characteristics are deteriorated. However, because the stiffness of the electrode is higher than $SiO_2$, the Q is improved. Accordingly, in this preferred embodiment, a piezoelectric resonator having low TCF and high Q is manufactured.

Second Preferred Embodiment

Figure 7:
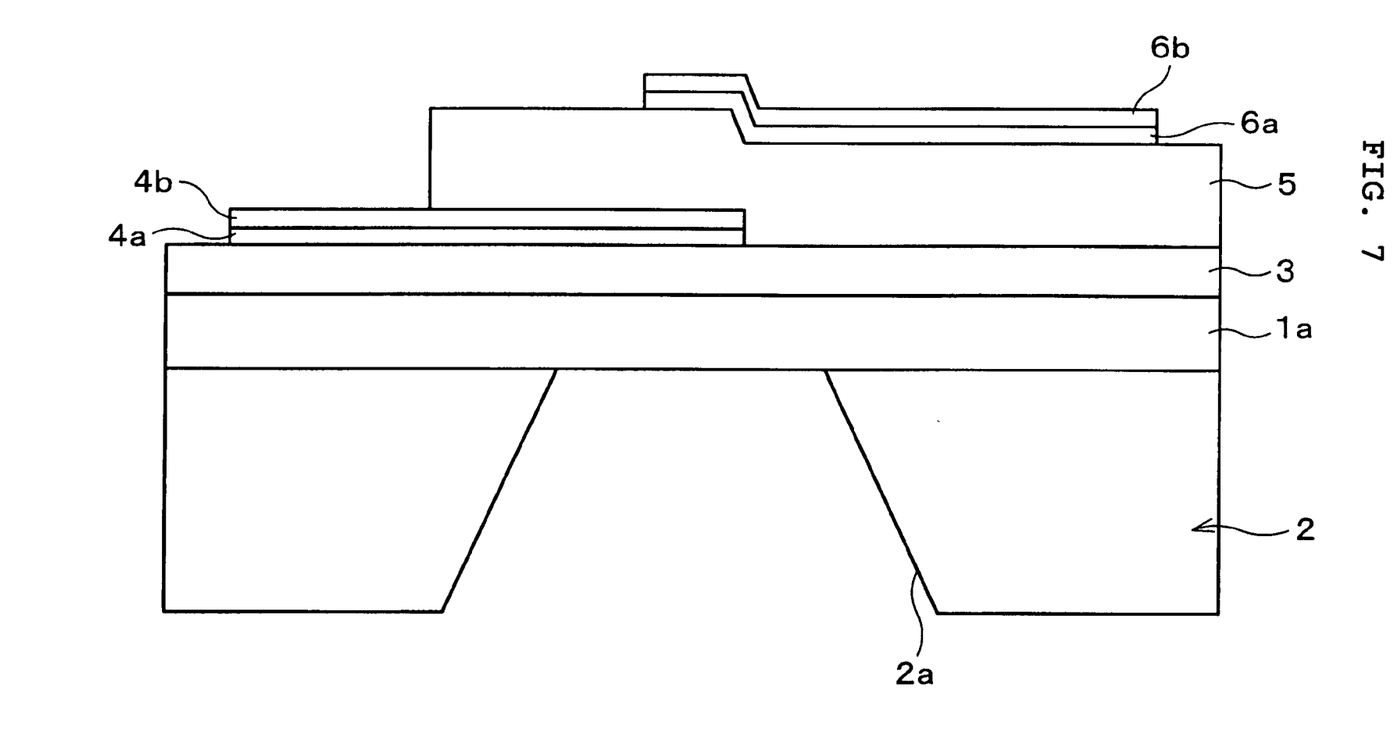
FIG. 7 is a cross-sectional view showing the configuration of a piezoelectric thin-film resonator according to a second preferred embodiment of the present invention.

FIG. 7 is a cross-sectional view showing the configuration of a piezoelectric thin-film resonator according to a second preferred embodiment of the present invention. This piezoelectric thin-film resonator has almost the same configuration as that of the piezoelectric thin-film resonator of the first preferred embodiment of the present invention.

Specifically, the piezoelectric thin-film resonator according to the second preferred embodiment preferably includes a supporting substrate 2 including silicon, an opening (hollow portion) 2a being provided therein. Also, an $SiO_2$ film 1a and an AlN film 3, serving as insulating films (supporting films), are formed on the supporting substrate 2 so as to form a diaphragm. Preferably, a base electrode 4a including Ti, a lower electrode (first electrode) 4b including Pt, a piezoelectric thin-film 5 mainly including ZnO, a base electrode 6a including Ti, and an upper electrode (second electrode) 6b including Pt are formed in order on the diaphragm.

In the piezoelectric thin-film resonator according to the second preferred embodiment, the base electrodes 4a and 6a including Ti are provided under the lower electrode 4b and the upper electrode 6b, respectively. The Ti of the base electrodes 4a and 6a is preferentially oriented in the (001) plane. The effect of the base electrodes, which will be described later, can be obtained if the base electrode is provided under only one of the lower electrode 4b and the upper electrode 6b.

As described above, the stiffness of Pt used for the lower electrode 4b and the upper electrode 6b is higher than that of the piezoelectric thin-film 5, and thus Pt is a preferable material for the electrodes. However, because the adhesion strength of Pt is low, the lower electrode 4b and the upper electrode 6b may be separated from the substrate 2, the insulating AlN film 3, and the piezoelectric thin-film 5.

In order to overcome such a problem, in the second preferred embodiment, the base electrodes 4a and 6a are provided under the lower electrode 4b and the upper electrode 6b, respectively. Further, the base electrodes 4a and 6a preferably includes Ti, which strongly adheres to the substrate 2 the insulating AlN film 3, and the piezoelectric thin-film 5, and thus the lower electrode 4b and the upper electrode 6b are not peeled off. The base electrodes 4a and 6a may include Cr or NiCr instead of Ti.

In this preferred embodiment, Pt is preferably used for both the lower electrode 4b and the upper electrode 6b. Alternatively, as described in the first preferred embodiment, at least one of the lower electrode 4b and the upper electrode 6b may include a material whose stiffness is higher than that of the piezoelectric thin-film 5, for example, Ni, Ta, Nb, Mo, W, stainless alloy, Al alloy, Al with additives (for example, Cu, Mg, Si, and Zn), or elinvar. Because the stiffness of these materials is higher than that of the piezoelectric thin-film 5, a piezoelectric resonator of high Q and high $k^2$ can be obtained.

Alternatively, one of the lower electrode 4b and the upper electrode 6b may include Ir, Ni, Au, Cu, or Mo, whose acoustic impedance in the propagation direction of an elastic wave is larger than the acoustic impedance in the propagation direction of an elastic wave of ZnO or AlN of the piezoelectric thin-film 5.

By using these materials, an elastic wave is reflected at the interface between these films and the piezoelectric thin-film 5, energy is easily trapped in the piezoelectric thin-film 5, and thus the resonance characteristics are further improved.

Each of Ir, Ni, Au, Cu, and Mo has either low adhesion strength or large stress. Thus, as in the case where Pt is used, the lower electrode 4b and the upper electrode 6b may be separated from the substrate 2, the insulating film, or the piezoelectric thin-film 5.

However, as in the second preferred embodiment of the present invention, by providing the base electrodes 4a and 6a under the lower electrode 4b and the upper electrode 6b and by using Ti, Cr, or NiCr having a high adhesion strength for the base electrodes 4a and 6a, the electrodes can be prevented from being peeled off. Thus, a piezoelectric thin-film resonator having preferable characteristics is obtained.

Also, in the second preferred embodiment, Ti of the base electrodes is preferentially orientated in the (001) plane. The lattice constant of Ti is 0.295 nm, which is close to the lattice constant of the ZnO (0.32 nm) and the AlN (0.31 nm) used for the piezoelectric thin-film 5. That is, a preferable consistency of lattice constant is obtained.

Because the Ti of the base electrodes 4a and 6a is preferentially oriented in the (001) plane, the crystallinity of the lower electrode 4b is improved and the crystallinity of the piezoelectric thin-film 5 is also improved. As a result, the resonance characteristics are improved.

Instead of Ti, Cr or NiCr may be used for the base electrode 4a under the lower electrode 4b. In order to minimize the difference between the lattice constants, NiCr, whose lattice constant is 0.25 nm, may preferably used,. In particular in order minimize the difference in the lattice constants, it is preferable that the NiCr is preferentially oriented in the (111) plane.

Accordingly, as in the case where Ti is used, the crystallinity of the lower electrode 4b is improved, the crystallinity of the piezoelectric thin-film 5 is also improved, and thus the resonance characteristic is improved. Also, by improving the crystallinity of the lower electrode 4b, the resistance to electrical power of the piezoelectric thin-film resonator is improved.

The base electrode 6a under the upper electrode 6b not only serves as an adhesive layer for the upper electrode 6b but also has an orientation layer. Therefore, the crystallinity of the upper electrode 6b is improved and the resistance to electrical power of the piezoelectric thin-film resonator can be improved.

Figure 8:
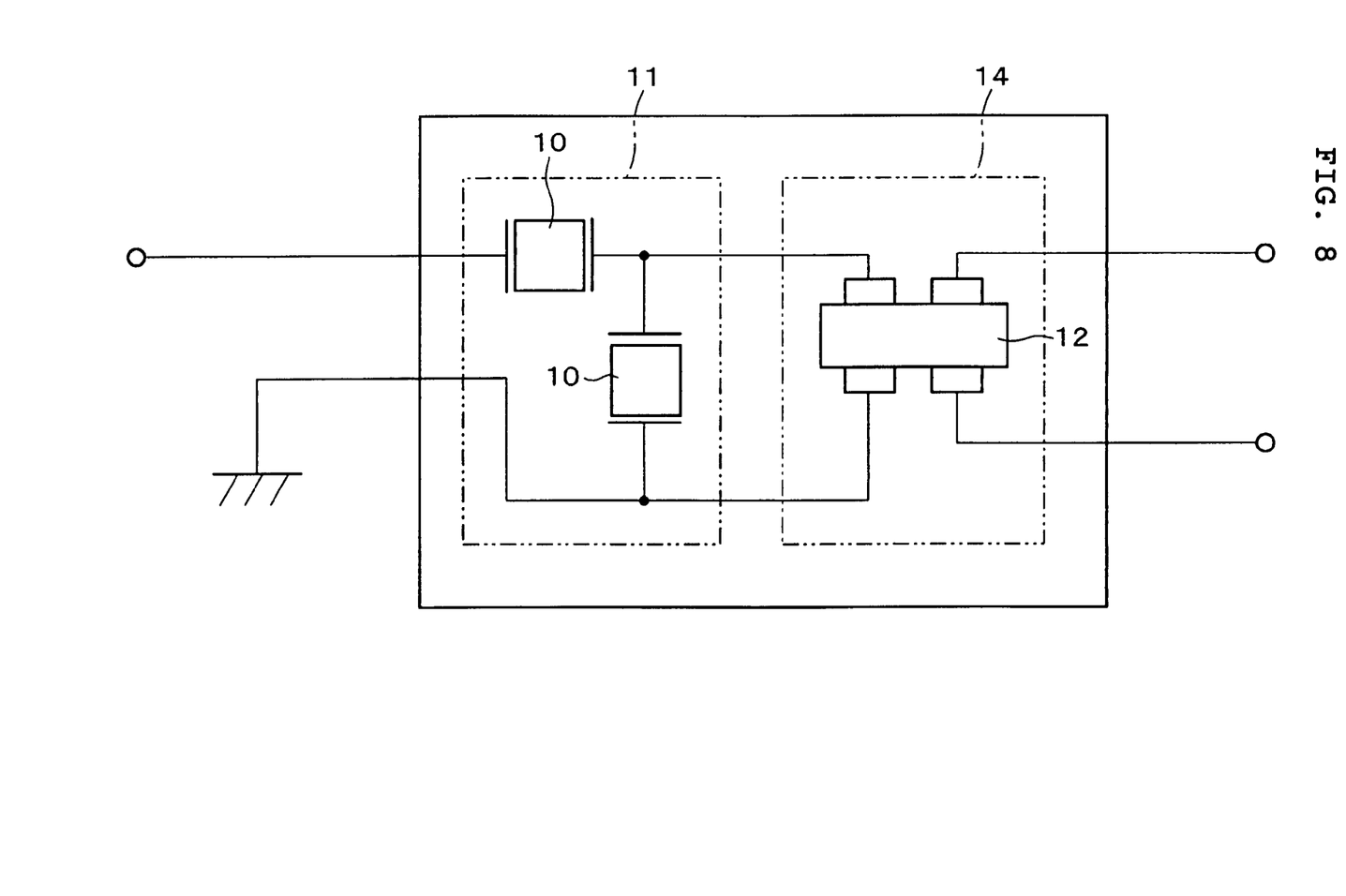
FIG. 8 is a circuit block diagram of a ladder filter and a multimode filter, serving as piezoelectric filters using the piezoelectric thin-film resonator.
Figure 9A:
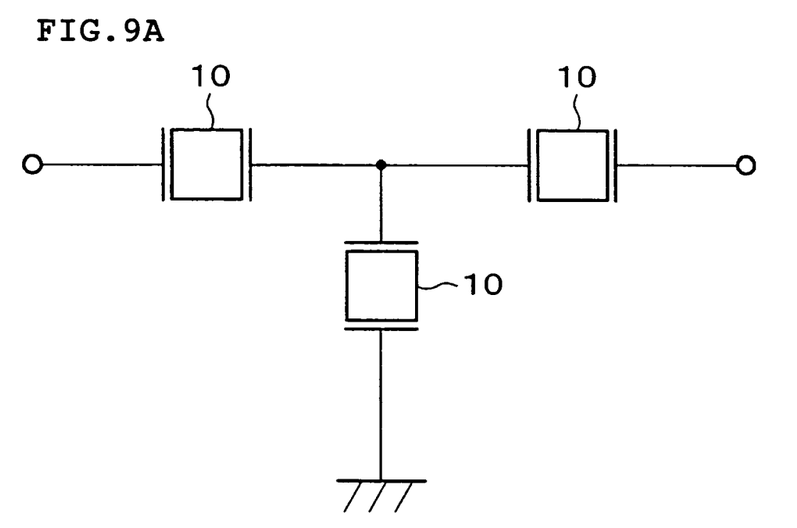
Figure 9B:
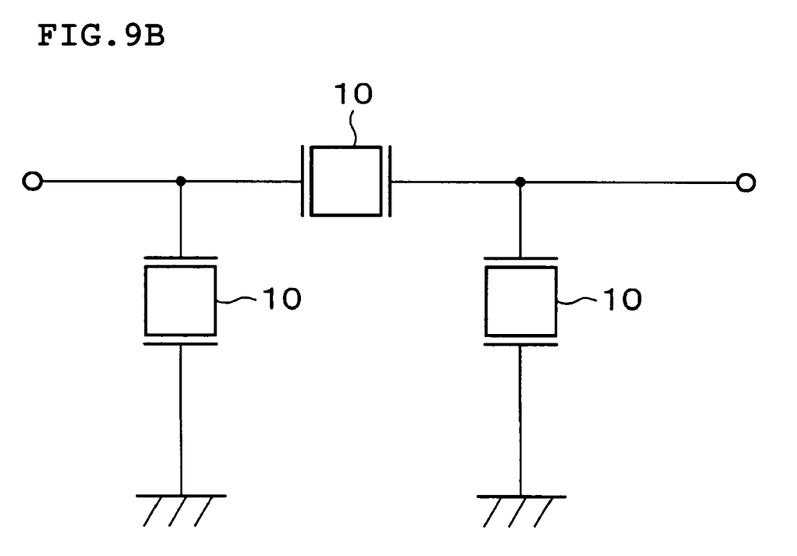

Next, a piezoelectric filter using the above-described piezoelectric thin-film resonator 10 will be described with reference to FIG. 8. As shown in FIG. 8, a piezoelectric filter 11 can be formed by ladder-connecting a plurality of the piezoelectric thin-film resonators 10 shown in FIG. 1 or 7 in an L-shape. Alternatively, the resonators may be connected in a T-shape or a Π-shape, as shown in FIGS. 9A and 9B.

In the ladder piezoelectric filter, the stiffness of the electrode of the piezoelectric thin-film resonator 10 in a parallel side is desirably higher than the stiffness of the electrode of the piezoelectric thin-film resonator 10 in a series side. With this arrangement, the Q of the piezoelectric thin-film resonator 10 in the parallel side is improved, the insertion loss of the ladder piezoelectric filter is reduced, and shouldering is suppressed in a low-frequency side of the pass band.

Figure 1:
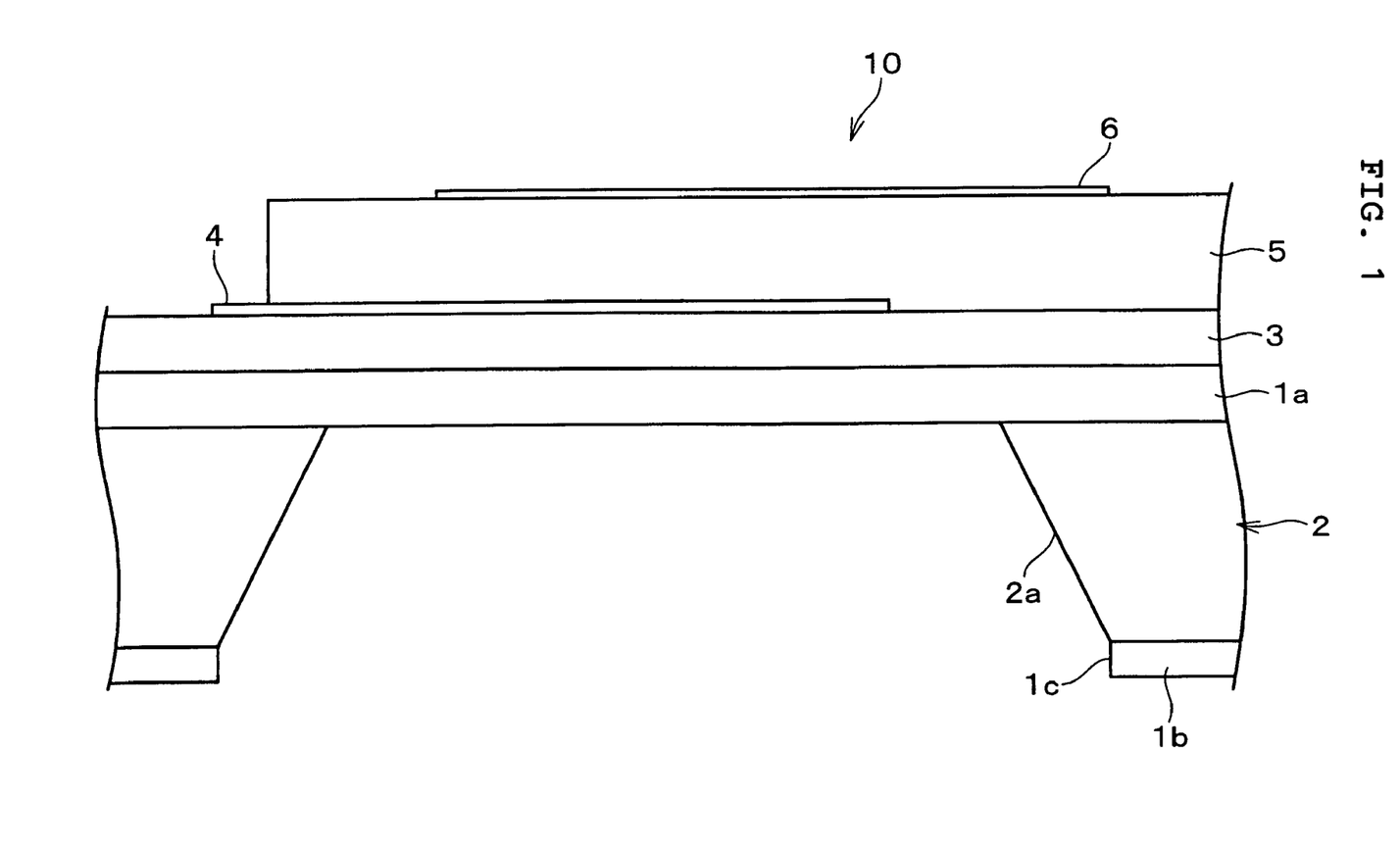
FIG. 1 is a cross-sectional view showing the configuration of a piezoelectric thin-film resonator according to a first preferred embodiment of the present invention.

Also, as shown in FIG. 8, a multimode filter (piezoelectric filter) 14 may be formed by using a piezoelectric thin-film resonator 12 having electrodes, whose configuration is different from those of the piezoelectric thin-film resonator 10 shown in FIG. 1 or 7. In the multimode filter 14, by adjusting the size and mass of each electrode and the distance between the electrodes, an unbalanced signal can be converted to a balanced signal or a balanced signal can be converted to an unbalanced signal.

By combining the multimode filter 14 having a balanced-to-unbalanced converting function and the piezoelectric filter 11 having a low insertion loss, excellent filter characteristics and a balanced-to-unbalanced converting function are simultaneously realized.

In the above-described piezoelectric filters 11 and 14, because the upper electrode 6 serves as an elastic member, the Q of the piezoelectric thin-film resonator 10 is improved. Accordingly, insertion loss of the piezoelectric filters 11 and 14 can be improved and the shouldering can be suppressed.

Figure 10:
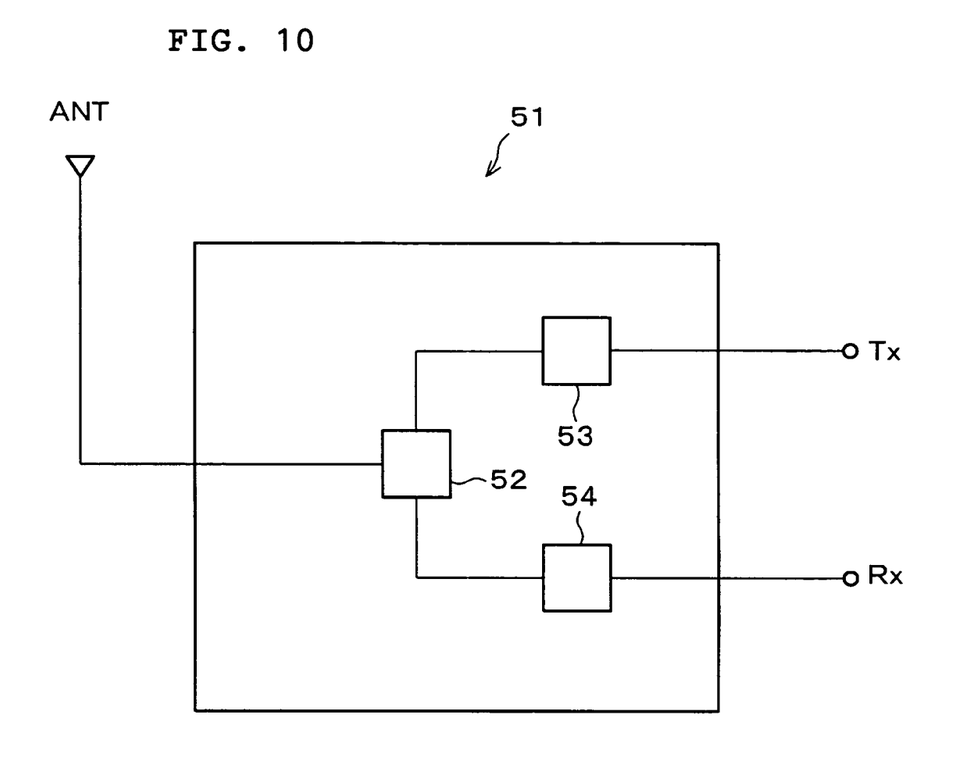
FIG. 10 is a circuit block diagram of a duplexer serving as an electronic component including the piezoelectric filter.

As shown in FIG. 10, a duplexer according to a preferred embodiment of the present invention includes a matching circuit 52 connected to an antenna (ANT), a transmission filter 53 connected between the matching circuit 52 and a transmission terminal (Tx), and a reception filter 54 connected between the matching circuit 52 and a reception terminal (Rx). The pass band of the transmission filter 53 and that of the reception filter 54 are different from each other.

Preferably, at least one of the transmission filter 53 and the reception filter 54 includes the piezoelectric filters 11 and 14 of the present invention. With this arrangement, a duplexer having suppressed shouldering and preferable filter characteristics is realized. Suppressed shouldering means that the frequency interval required to attenuate the frequency at the upper and lower end of the passband to a predetermined attenuation frequency is small.

Such a piezoelectric filter can be set so as to have a balanced terminal and an unbalanced terminal, and thus can be easily applied to a duplexer. In this case, by connecting the terminal of the ladder filter 11 to the antenna-side and connecting the terminal of the multimode filter 14, which converts an unbalanced output to a balanced output, to an internal circuit such as IC, a duplexer can be formed without additional components.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric thin-film resonator comprising:
   a supporting substrate;
   a piezoelectric thin-film disposed on the supporting substrate; and
   a first electrode and a second electrode facing each other with the piezoelectric thin-film therebetween;
   wherein a stiffness of at least one of the first and second electrodes is higher than a stiffness of the piezoelectric thin-film;
   an insulating film is formed between the piezoelectric thin-film and the supporting substrate; and
   the insulating film includes a plurality of insulating thin-films having different temperature coefficients.

2. The piezoelectric thin-film resonator according to claim 1, wherein the insulating film includes at least one of a $Al_2O_3$, $SiO_2$, and SIN.

3. The piezoelectric thin-film resonator according to claim 1, wherein the piezoelectric thin-film includes at least one of ZnO, AlN, PZT, and CdS.

4. A piezoelectric filter comprising the piezoelectric thin-film resonator according to claim 1.

5. An electronic component comprising the piezoelectric filter according to claim 4.

6. The piezoelectric thin-film resonator according to claim 1, wherein the piezoelectric thin-film resonator has a cantilever structure or an overhang structure.

7. The piezoelectric thin-film resonator according to claim 1, wherein one of the first electrode and the second electrode includes at least one of Pt, Ir, Ni, Ta, Nb, W, Cu, Mo, Al alloy, and elinvar.

8. The piezoelectric thin-film resonator according to claim 1, wherein
   the difference between a lattice constant in a direction vertical to a vibration direction of the piezoelectric thin-film and the lattice constant in a direction vertical to a vibration direction of a material of the electrode is about 5% or less.

9. The piezoelectric thin-film resonator according to claim 8, wherein the stiffness of the at least one of the first and second electrodes is higher than the stiffness of the piezoelectric thin-film in a direction that is substantially parallel to a vibration direction of the piezoelectric thin-film.

10. The piezoelectric thin-film resonator according to claim 8, wherein at least one of the first and second electrodes includes at least one of Ta, Nb, Mo, Pt, W, Cu, Ir, Ni, Al alloy, and elinvar.

11. The piezoelectric thin-film resonator according to claim 8, wherein the piezoelectric thin-film includes at least one of ZnO, AlN, PZT, and CdS.

12. A piezoelectric filter comprising the piezoelectric thin-film resonator according to claim 8.

13. An electronic component comprising the piezoelectric filter according to claim 12.

14. The piezoelectric thin-film resonator according to claim 8, wherein the piezoelectric thin-film resonator has a cantilever structure or an overhang structure.

15. A piezoelectric filter comprising at least one piezoelectric thin-film resonator according to claim 8 and a balanced-unbalanced conversion function.

16. The filter according to claim 15, wherein the balance-unbalanced conversion function is provided by a multimode filter.

17. An electronic component comprising the piezoelectric filter according to claim 15.

18. The piezoelectric thin-film resonator according to claim 8, wherein the first electrode is disposed between the supporting substrate and the piezoelectric thin-film and includes at least one of Pt and Al.

19. A piezoelectric filter comprising at least one piezoelectric thin-film resonator according to claim 1 and a balanced-unbalanced conversion function.

20. The filter according to claim 19, wherein the balance-unbalanced conversion function is provided by a multimode filter.

21. An electronic component comprising the piezoelectric filter according to claim 19.

22. A piezoelectric thin-film resonator comprising:
   a supporting substrate;
   a piezoelectric thin-film disposed on the supporting substrate; and
   a first electrode and a second electrode facing each other with the piezoelectric thin-film therebetween;
   wherein a stiffness of at least one of the first and second electrodes is higher than a stiffness of the piezoelectric thin-film;
   an insulating film is formed between the piezoelectric thin-film and the supporting substrate; and
   the insulating film comprises a plurality of insulating thin-films and wherein at least one of the plurality of insulating thin-films generates compressive stress and at least another of the plurality of insulating thin-films generate tensile stress.

23. The piezoelectric thin-film resonator according to claim 22, wherein one of the first electrode and the second electrode includes at least one of Pt, Ir, Ni, Ta, Nb, W, Cu, Mo, Al alloy, and elinvar.

* * * * *